US009875889B2

(12) United States Patent
Thompson

(10) Patent No.: US 9,875,889 B2
(45) Date of Patent: Jan. 23, 2018

(54) ATOMIC LAYER DEPOSITION OF FILMS COMPRISING SI(C)N USING HYDRAZINE, AZIDE AND/OR SILYL AMINE DERIVATIVES

(71) Applicant: Applied Materials, Inc., Santa Clara, CA (US)

(72) Inventor: David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/000,116

(22) Filed: Jan. 19, 2016

(65) Prior Publication Data

US 2016/0133460 A1 May 12, 2016

Related U.S. Application Data

(62) Division of application No. 14/205,921, filed on Mar. 12, 2014, now abandoned.

(60) Provisional application No. 61/777,853, filed on Mar. 12, 2013.

(51) Int. Cl.

*H01L 21/02* (2006.01)
*C23C 16/36* (2006.01)
*C23C 16/455* (2006.01)

(52) U.S. Cl.

CPC ........ *H01L 21/02167* (2013.01); *C23C 16/36* (2013.01); *C23C 16/45531* (2013.01); *C23C 16/45553* (2013.01); *H01L 21/0228* (2013.01); *H01L 21/02211* (2013.01); *H01L 21/02274* (2013.01)

(58) Field of Classification Search

None
See application file for complete search history.

(56) References Cited

U.S. PATENT DOCUMENTS 5,186,718 A 2/1993 Tepman et al.
7,365,029 B2 4/2008 Iyer et al.
2005/0025885 A1 2/2005 McSwiney et al.
2009/0246974 A1 10/2009 Clark
2010/0062614 A1* 3/2010 Ma .......................... C23C 16/34 438/785
2014/0051262 A9 2/2014 Lavoie et al.

OTHER PUBLICATIONS

Non-Final Office Action in U.S. Appl. No. 14/205,921, dated Nov. 13, 2015, 11 pages.
Final Office Action in U.S. Appl. No. 14/205,921, dated Apr. 29, 2015, 8 pages.

* cited by examiner

*Primary Examiner* — Alexander Ghyka
(74) *Attorney, Agent, or Firm* — Servilla Whitney LLC

(57) ABSTRACT

Provided are methods for the deposition of films comprising Si(C)N via atomic layer deposition processes. The methods include exposure of a substrate surface to a silicon precursor and a co-reagent comprising a compound selected from the group consisting of N═N═N—R, $R_2N—NR_2$, and $(R_3Si)_q NH_{3-q}$, wherein q has a value of between 1 and 3, and each R is independently selected from organosilicons, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

12 Claims, No Drawings

ATOMIC LAYER DEPOSITION OF FILMS COMPRISING SI(C)N USING HYDRAZINE, AZIDE AND/OR SILYL AMINE DERIVATIVES

CROSS-REFERENCE TO RELATED APPLICATIONS

This application is a divisional of U.S. Non-provisional application Ser. No. 14/205,921, filed Mar. 12, 2014, which claims priority to U.S. Provisional Application No. 61/777,853, filed Mar. 12, 2013, the entire contents of which are herein incorporated by reference.

TECHNICAL FIELD

The present invention relates generally to methods of depositing thin films. In particular, the invention relates to atomic layer deposition processes for the deposition of SiCN films.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In step B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain the desired film thickness. Because of the usefulness of ALD processes, there is an ongoing need for new ALD chemistries.

Silicon nitride (SiN) is a commonly used dielectric throughout the semiconductor industry. One method of SiN deposition utilizes a halosilane silicon precursor and ammonia co-reactant. A commonly used halosilane is monochlorosilane. The driving force for N—H Cl—Si condensation is very high, leading to HCl formation. However, in the presence of gas phase $NH_3$, $NH_3$ and HCl react to yield $NH_4Cl(s)$ (ammonium chloride), which results in particle formation. Moreover, this reaction is in equilibrium at 1 ATM at 330° C. Ammonium chloride has a relatively low vapor pressure and can clog up chamber exhausts. Thus, there is a need for new ALD chemistries which produce byproducts having a higher vapor pressure.

Additionally, there is an increasing need for dielectrics with lower dielectric constant (k) values and with lower etch rates. Thus, there is a need for ALD chemistries of improved dielectrics.

Additionally, a common problem with Si(C)N deposition pertains to ammonium chloride management in the chamber.

SUMMARY

One aspect of the invention pertains to a method of depositing a film comprising Si(C)N. The method comprises exposing a substrate surface to a silicon precursor and a co-reactant, wherein the silicon precursor contains at least one Si—X bond, wherein X is a halogen, and the co-reactant comprises a compound selected from the group consisting of N═N═N—R, $R_2N$—$NR_2$, and $(R_3Si)_qNH_{3-q}$, wherein q has a value of between 1 and 3, and each R is independently selected from silyl, monomethyl silyl, dimethyl silyl and trimethyl silyl, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. In one or more embodiments, each R is independently C1-C6 alkyl. In some embodiments, each R is methyl.

In one or more embodiments, the co-reactant comprises $(R_3Si)_qNH_{3-q}$. In some embodiments, the co-reactant comprises N-methylhydrazine, 1,1-dimethylhydrazine, or 1,1,2,2-tetramethylhydrazine. In one or more embodiments, the co-reactant comprises trimethylsilylazide.

In some embodiments, the silicon precursor has formula $(X_yH_{3-y}Si)_zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen selected from Cl, Br and I, y has a value of between 1 and 3, z has a value of between 1 and 3, p has a value of between 0 and 2, and n has a value between 2 and 5. In one or more embodiments, the silicon precursor has a formula $(X_yH_{3-y}Si)_zCH_{4-z}$. In some embodiments, the silicon precursor has a formula $(X_yH_{3-y}Si)(CH_2)_n(SiX_yH_{3-y})$, wherein X is a halogen selected from Cl, Br and I, y has a value of between 1 and 3, and n has a value between 2 and 5. In one or more embodiments, the silicon precursor comprises $SiH_{4-r}X_r$ or $H_{3-t}X_tSi$—$SiH_{3-t}X_t$, wherein each X is a halogen, r has a value of 1 to 4, and t has a value of 1 to 3. In some embodiments, the silicon precursor comprises monochlorosilane.

In one or more embodiments, the silicon precursor or the co-reactant comprises carbon, and a film comprising silicon carbonitride is provided. In some embodiments, a film comprising silicon nitride is provided.

A second aspect of the invention pertains to a method of plasma enhanced atomic layer deposition of a film comprising Si(C)N. The method comprises exposing a substrate surface to a silicon precursor, wherein the silicon precursor contains at least one Si—X bond, wherein X is a halogen; and subsequently exposing a substrate to a co-reactant and striking a plasma, wherein the co-reactant comprises a compound selected from the group consisting of N═N═N—R and $R_2N$—$NR_2$, wherein q has a value of between 1 and 3, and each R is independently selected from C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

In one or more embodiments, each R is C1-C6 alkyl. In some embodiments, each R is methyl. In one or more embodiments, the co-reactant comprises N-methylhydrazine, 1,1-dimethylhydrazine, or 1,1,2,2-tetramethylhydrazine. In some embodiments, the substrate has a temperature of about 50 to about 250° C. In one or more embodiments, the silicon precursor comprises monochlorosilane.

A third aspect of the invention pertains to a method of depositing a film comprising Si(C)N, the method comprising exposing a substrate surface to hexachlorodisilane, dichlorosilane or monochlorosilane, wherein X is a halogen, and the co-reactant comprises a compound selected from the group consisting of N═N═N—R, $R_2N—NR_2$, and $(R_3Si)_qNH_{3-q}$, wherein q has a value of between 1 and 3, and each R is independently C1-C6 alkyl.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways. It is also to be understood that the chemical compounds of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such compounds having the indicated chemical formula.

SiN and/or SiCN films may be deposited using silicon precursors with certain nitrogen-containing co-reagents. In particular, the nitrogen-containing co-reagents are derivates of azides, hydrazines and ammonia substituted with trimethylsilyl groups. When these co-reagents are used in conjunction with silicon precursors that contain carbon, the resulting film will comprise silicon, carbon and nitrogen. When the silicon precursors do not contain carbon, the resulting film will comprise silicon and nitrogen.

Accordingly, one aspect of the invention relates to a method of depositing a film comprising Si(C)N, the method comprising exposing a substrate surface to a silicon precursor and a co-reactant, wherein the silicon precursor contains at least one Si—X bond, wherein X is a halogen, and the co-reactant comprises a compound selected from the group consisting of N═N═N—R, $R_2N—NR_2$, and $(R_3Si)_qNH_{3-q}$, wherein q has a value of between 1 and 3, and each R is independently selected from silyl, monomethyl silyl, dimethyl silyl or trimethyl silyl, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

In some embodiments, the substrate surface that will be exposed to various precursors contains a layer that allows the reaction of either the first or second precursors. Examples include layers that contain reactive —OH or —NH moieties or handles.

The silicon precursor contains at least one Si—X bond, wherein X is a halogen. In some embodiments, X is selected from the group consisting of Cl, Br and I. In some embodiments, the silicon precursor acts as both a silicon and carbon source. In such embodiments, the silicon precursor also contains carbon atoms.

Accordingly, in one or more embodiments, the silicon precursor has formula $(X_yH_{3-y}Si)_zCH_{4-z}$, wherein X is a halogen, y has a value of between 1 and 3, z has a value of between 1 and 3. In one or more embodiments, each X is independently selected from Cl, Br and I. In further embodiments, embodiments at least one of the X groups is Cl. In even further embodiments, all X groups are Cl. Such a compound is known as bis(trichlorosilyl)methane, hexachlorodisilylmethylene, HCDSM, 1,1'-methylenebis(1,1,1-trichlorosilane), or methylenebis(trichlorosilane), and has a structure represented by:

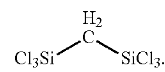

Other examples of suitable precursors of this variety include, but are not limited to those having structures represented by:

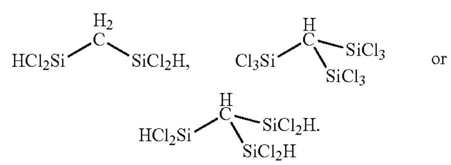

In other embodiments, the silicon precursor has a formula $(X_yH_{3-y}Si)(CH_2)_n(SiX_yH_{3-y})$, wherein X is a halogen selected from Cl, Br and I, y has a value of between 1 and 3, and n has a value between 2 and 5. In further embodiments, n has a value of 2 or 3, or in even further embodiments, 2. Compounds of this formula may be used to further increase the carbon content, as the starting C:Si ratio will be higher. In one or more embodiments, each X is independently selected from Cl, Br and I. In further embodiments, embodiments at least one of the X groups is Cl. In even further embodiments, all X groups are Cl.

$(X_yH_{3-y}Si)(CH_2)(SiX_pH_{2-p})(CH_2)(SiX_yH_{3-y})$, wherein X is a halogen selected from Cl, Br and I, y has a value of between 1 and 3, and p has a value of between 0 and 2. In one or more embodiments, each X is independently selected from Cl, Br and I. In further embodiments, embodiments at least one of the X groups is Cl. In even further embodiments, all X groups are Cl. Examples of such precursors include, but are not limited to, $(ClSiH_2)(CH_2)(SiH_2)(CH_2)(SiH_2Cl)$ and $(Cl_2SiH)(CH_2)(SiClH)(CH_2)(SiHCl_2)$. Again, compounds of this formula may be used to further increase the carbon content, as the starting C:Si ratio will be higher.

In one or more embodiments, the silicon precursor comprises $SiH_{4-r}X_r$ or $H_{3-t}X_tSi—SiH_{3-t}X_t$, wherein each X is a halogen, r has a value of 1 to 4, and t has a value of 1 to 3. In some embodiments, the halogen is selected from the group consisting of Cl, Br and I. In some embodiments, the first precursor comprises $SiX_4$. In other embodiments, the first precursor comprises $X_3Si—SiX_3$. In one or more embodiments, each X is independently selected from Cl, Br and I. In further embodiments, embodiments at least one of the X groups is Cl. An example of a suitable compound includes monochlorosilane. In even further embodiments, all X groups are Cl. In embodiments where the first precursor comprises $X_3Si—SiX_3$, and all X groups are chlorine, the compound is $Cl_3Si—SiCl_3$, also known as hexachlorodisilane. Accordingly, in one or more embodiments, the silicon precursor is selected from $SiCl_4$, $SiBr_4$, or $SiI_4$.

In embodiments relating to deposition of SiCN, at least one of the silicon precursor or co-reagent must contain carbon for it to be SiCN. The presence of carbon in the films can be advantageous, as it lowers the dielectric constant of the analogous SiN film. In some embodiments, the deposited film is silicon carbonitride (SiCN). In some embodiments, the amount of silicon will range from about 30 to about 40%. In one or more embodiments, the amount of nitrogen will range from about 40 to about 50%. In embodiments relating to SiCN, the carbon content of the film is less than about 30, 25 or 20%. In some embodiments, the carbon content of the film ranges from between about 5% to about 15%. It should be noted that some post-deposition treatment processes will reduce the amount of carbon in the film. This should be accounted for in determining the amount of carbon targeted for the desired film. There may also be hydrogen in the film.

If neither precursor contains carbon, then the resulting film comprises silicon nitride (SiN). The exact composition of the film will depend on the precursors utilized, and the amount of hydrogen in the film. In some embodiments, the ratio of silicon to nitrogen in the deposited film will be about 3 to about 4. Generally, the more hydrogen present in the film, the close the ratio of silicon to nitrogen will be 1:1. In some embodiments, the overall elemental content of the film will be about 30-40% silicon and about 60-70% nitrogen. There may also be hydrogen in the film.

Although there can be some Si—H bonds in the silicon precursor, it may be advantageous in some embodiments to have more halogen-silicon bonding. Such situations include those where there is a desire to increase the stress of the film. That is, the stress in a film can be tuned by tuning the amount of Si—H bonding there is in the film. The fewer Si—H bonds in the starting precursor, the fewer Si—H bonds in the resulting film, thereby having an increased stress. The silicon/carbon precursors described herein can better deposit SiCN films than other means of carbon incorporation, as the precursors already contain Si—C bonds. As such, Si—C bonding in the film can be ensured.

The precursors can be selected to tune the amount of carbon in the deposited film. The higher the carbon: silicon ratio of the precursors, the higher the ratio will be in the resulting SiOC film. For example, in embodiments where the silicon precursor has formula $(X_yH_{3-y}Si)(CH_2)_n(SiX_yH_{3-y})$, longer carbon chains can be selected to result in a higher carbon content in the deposited film. If the desired amount of carbon is less than that when a precursor with just one carbon atom is utilized, then a higher ratio of silicon can be deposited by using a silane-based precursor. Such precursors include hexachlorodisilane ($Cl_3Si—SiCl_3$). Thus, in some embodiments, the method further comprises exposing the substrate surface to a third precursor, which may comprise hexachlorodisilane. This allows for silicon to be deposited at a higher rate than would otherwise be afforded with just the carbon-containing precursor. An exemplary sequence could comprise flowing: $(X_yH_{3-y}Si)_zCH_{4-z}$, co-reactant, $Cl_3Si—SiCl_3$, and co-reactant.

The co-reactant comprises a compound selected from the group consisting of N═N═N—R, $R_2N—NR_2$, and $(R_3Si)_qNH_{3-q}$, wherein q has a value of between 1 and 3, and each R is independently selected from each R is independently selected from silyl, monomethyl silyl, dimethyl silyl, trimethyl silyl, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. In further embodiments, each R is wherein each R is independently C1-C6 alkyl. In further embodiments, each R group is methyl. It should be noted that the R group may contain silicon atoms, which will help to contribute to the silicon content of the deposited film. An example of a suitable organosilicon group includes a silyl or alkylsilyl group, particularly trimethyl silyl (TMS). In one or more embodiments, the silyl amine comprises trimethylsilylamine or N,N-bis(trimethylsilyl)amine (also known as hexamethyldisilazane).

In some embodiments, the co-reactant comprises $(R_3Si)_qNH_{3-q}$, wherein q has a value of between 1 and 3, and each R is independently selected from organosilicons, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. $(R_3Si)_qNH_{3-q}$ is referred to as a silyl amine, wherein at least one of the hydrogens is replaced with a silyl group. In embodiments where R is alkyl, the moiety is known as an alkylsilyl amine. Alkyl silyl amines are expected to provide advantages over alkylamines, because the alkylsilyl group is a better leaving group than an alkyl group. In embodiments where all R groups on a given silicon atom are methyl, the moiety is known as a trimethyl silyl (TMS) group. In some embodiments, each R is independently C1-C6 alkyl. In other embodiments, each R is methyl. Specific examples of suitable co-reactants include, but are not limited to, N-methylhydrazine, 1,1-dimethylhydrazine, or 1,1,2,2-tetramethylhydrazine.

In one or more embodiments, the co-reactant comprises N═N═N—R, wherein each R is independently selected from organosilicons, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. In some embodiments, each R is independently C1-C6 alkyl. Such a compound is referred to as an azide or azide derivative. It should be noted that the R group may contain silicon atoms, which will help to contribute to the silicon content of the deposited film. An example of a suitable organosilicon group includes a silyl or alkylsilyl group, particularly trimethyl silyl (TMS). A particular example of a suitable azide derivative includes trimethylsilylazide (also known as azidotrimethylsilane).

In some embodiments, the co-reactant comprises $R_2N—NR_2$, wherein each R is independently selected from organosilicons, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. Such a compound is referred to as a hydrazine or hydrazine derivative. In some embodiments, each R is independently C1-C6 alkyl. It should be noted that the R group may contain silicon atoms, which will help to contribute to the silicon content of the deposited film. An example of a suitable organosilicon group includes a silyl or alkylsilyl group, particularly trimethyl silyl (TMS).

In an exemplary process of depositing a film comprising Si(C)N, the method comprises exposing a substrate surface to hexachlorodisilane, dichlorosilane or monochlorosilane, wherein X is a halogen, and the co-reactant comprises a compound selected from the group consisting of N═N═N—R, $R_2N—NR_2$, and $(R_3Si)_qNH_{3-q}$, wherein q has a value of between 1 and 3, and each R is independently C1-C6 alkyl.

The substrate temperature during deposition may range from about 200 to about 550° C. In further embodiments, the temperature ranges from about 300 to about 400° C.

Another aspect of the invention pertains to a plasma enhanced atomic layer deposition process for the deposition of a film comprising Si(C)N. The method comprises: (a) exposing a substrate surface to a silicon precursor, wherein the silicon precursor contains at least one Si—X bond, wherein X is a halogen; and (b) subsequently exposing a substrate to a co-reactant and striking a plasma, wherein the co-reactant comprises a compound selected from the group consisting of N═N═N—R and $R_2N—NR_2$, wherein q has a value of between 1 and 3, and each R is independently selected from C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

Generally, many of the same features of the first aspect apply to this aspect as well. For example, any of the above silicon precursors may be utilized for the PEALD process. However, in one or more embodiments, the co-reactant does not comprise silicon. While not wishing to be bound to any particular theory, it is thought that when silicon is present, the silicon radicals will deposit into the film. The process takes on a nature similar to plasma enhanced chemical vapor deposition (PECVD). This process will not be self-limited, and will result in films which are less conformal. In contrast, it is thought that with carbon radicals, carbon does not deposit, and in fact, the carbon radicals will actually remove hydrogen from the film, which may be advantageous.

In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes without a plasma. In one or more embodiments, the substrate temperature during the PEALD process ranges from about 50 to about 250° C.

In an exemplary process, a wafer is placed into a chamber. The wafer is exposed to a silicon-containing precursor featuring a Si—X bond, such a dichlorosilane. The silicon precursor reacts with the wafer surface. Excess precursor is purged from the chamber. A co-reagent that does not contain silicon (e.g., methyl azide) is flowed into the chamber using a carrier gas (e.g., Argon). Then, a plasma of the co-reagent may be struck over the wafer, allowing for reaction of the co-reagent with the silicon precursor. The plasma is then stopped, and the flow of the co-reagent is stopped. Excess co-reagent is purged from the chamber. The process can then be repeated until a desired film thickness is achieved.

The precursors may be flowed and/or exposed to the substrate surface either sequentially or substantially sequentially. In embodiments where the substrate is exposed to the precursors sequentially, the process may be repeated up until a desired film thickness has been achieved. As used herein, "substantially sequentially" refers to where a majority of the duration of the exposure/flow of the silicon precursor does not overlap with exposure/flow of the co-reagent, although there may be some overlap. Any of the above processes may be repeated. In one or more embodiments, the process is repeated until a desired film thickness is achieved.

One or more of the processes described herein may include a purge. The purging process aids in keeping the reagents separate. Unwanted mixture of reagents may degrade step coverage. The substrate and chamber may be exposed to a purge step after stopping the flow of one or more of the reagents. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

Generally, the reaction conditions for the ALD reactions will be selected based on the properties of the film precursors and substrate surface. The deposition may be carried out at atmospheric pressure, but may also be carried out at reduced pressure. The vapor pressure of the precursors/co-reagents should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and pressure. The properties of the specific substrate and film precursors may be evaluated using methods known in the art, allowing selection of appropriate temperature and pressure for the reaction.

In one or more embodiments, the processes described herein do not produce ammonium chloride ($NH_4Cl$) byproducts, and instead produce HCl or other byproducts (e.g., $ClSi(CH_3)_3$) that have a higher vapor pressure than $NH_4Cl$. As stated above, the driving force for N—H/Cl—Si condensation is very high, which leads to HCl formation. With current methods that use ammonia, ammonia can react with HCl to produce ammonium chloride. However, with one or more of the co-reagents described herein, the HCl remains intact, or other byproducts are formed. For example, the HCl salt of hydrazine decomposition is 200° C., and N,N'-dimethylhydrazine dihydrochloride is only 170° C., whereas that of ammonia is 338° C. Moreover, the higher vapor pressure associated with the byproducts of one or more of the processes described herein can advantageously allow for lower chamber temperatures, and reduction of clogging of chamber exhausts associated with $NH_4Cl$.

Once any of the above-described films are deposited, the film may undergo further post-deposition processing. One example of such a process thermal spike and/or rapid thermal anneal processing. Another example of a post-deposition process is further exposing the film to an ultraviolet treatment. While not wishing to be bound to any particular theory, the ultraviolet treatment is thought to break Si—H and N—H bonds in the film, thereby allowing for Si—N bonds to form. As discussed above, a reduction in the Si—H bonding allows for an increase in strength capability.

The ultraviolet treatment can be carried out either during film deposition, or once deposition has been completed. That is, in one or more embodiments, the process may comprise exposure of the substrate surface to the silicon precursor, then a second precursor, followed by the ultraviolet treatment, and then the whole process is repeated. In other embodiments, the exposure to the first and second precursors may be repeated until a desired film thickness is achieved, then followed by the ultraviolet treatment. In other embodiments, varying combinations of the above are used. Thus for example, exposure to the first and second precursor may be repeated, then exposure to the ultraviolet treatment, then exposure to the first and second precursor, etc.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a film comprising Si(C)N, the method comprising exposing a substrate surface to a silicon precursor and a co-reactant, wherein the silicon precursor contains at least one Si—X bond, wherein X is a halogen and the silicon precursor has formula $(X_yH_{3-y}Si)(CH_2)(SiX_pH_{2-p})(CH_2)(SiX_yH_{3-y})$ or $(X_yH_{3-y}Si)(CH_2)_n(SiX_yH_{3-y})$, wherein X is a halogen selected from Cl, Br and I, y has a value of between 1 and 3, z has a value of between 1 and 3, p has a value of between 0 and 2, and n has a value between 2 and 5, and the co-reactant comprises a compound having the formula N═N═N—R, wherein R is independently selected from silyl, monomethyl silyl, dimethyl silyl and trimethyl silyl, C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

2. The method of claim 1, wherein R is independently C1-C6 alkyl.

3. The method of claim 2, wherein R is methyl.

4. The method of claim 1, wherein R is trimethyl silyl.

5. The method of claim 1, wherein the co-reactant comprises trimethylsilylazide.

6. The method of claim 1, wherein the silicon precursor or the co-reactant comprises carbon, and a film comprising silicon carbonitride is provided.

7. The method of claim 1, wherein a film comprising silicon nitride is provided.

8. A method of plasma enhanced atomic layer deposition of a film comprising Si(C)N, the method comprising a. exposing a substrate surface to a silicon precursor, wherein the silicon precursor contains at least one Si—X bond, the silicon precursor having a formula of $(X_yH_{3-y}Si)(CH_2)(SiX_pH_{2-p})(CH_2)(SiX_yH_{3-y})$ or $(X_yH_{3-y}Si)(CH_2)_n(SiX_yH_{3-y})$, wherein X is a halogen selected from Cl, Br and I, y has a value of between 1 and 3, z has a value of between 1 and 3, p has a value of between 0 and 2, and n has a value between 2 and 5; and b. subsequently exposing a substrate to a co-reactant and striking a plasma, wherein the co-reactant comprises N═N═N—R, wherein R is independently selected from C1-C6 substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

9. The method of claim 8, wherein R is C1-C6 alkyl.

10. The method of claim 9, wherein R is methyl.

11. The method of claim 8, wherein R is trimethyl silyl.

12. The method of claim 8, wherein the substrate has a temperature of about 50 to about 250° C.

* * * * *